(12) United States Patent
Manfrini et al.

(10) Patent No.: US 11,955,548 B2
(45) Date of Patent: Apr. 9, 2024

(54) TWO-DIMENSIONAL (2D) MATERIAL FOR OXIDE SEMICONDUCTOR (OS) FERROELECTRIC FIELD-EFFECT TRANSISTOR (FEFET) DEVICE

(71) Applicant: Taiwan Semiconductor Manufacturing Co., Ltd., Hsinchu (TW)

(72) Inventors: Mauricio Manfrini, Zhubei (TW); Chih-Yu Chang, New Taipei (TW); Sai-Hooi Yeong, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/315,687

(22) Filed: May 10, 2021

(65) Prior Publication Data

US 2022/0246766 A1    Aug. 4, 2022

Related U.S. Application Data

(60) Provisional application No. 63/143,056, filed on Jan. 29, 2021.

(51) Int. Cl.
*H01L 29/78* (2006.01)
*H01L 21/02* (2006.01)
(Continued)

(52) U.S. Cl.
CPC .. *H01L 29/78391* (2014.09); *H01L 21/02565* (2013.01); *H01L 21/443* (2013.01);
(Continued)

(58) Field of Classification Search
CPC ........... H01L 29/7869; H01L 29/78391; H01L 21/02565; H10B 51/00
See application file for complete search history.

(56) References Cited

U.S. PATENT DOCUMENTS 9,722,093 B1   8/2017 Xing et al.
2004/0061153 A1* 4/2004 Misewich ......... H01L 29/78391
                                                    257/295
(Continued)

FOREIGN PATENT DOCUMENTS

JP    2012004583 A    1/2012
KR   20100123106 A   11/2010
TW     201937771 A    9/2019

OTHER PUBLICATIONS

Troughton, Joe and Atkinson, Del (2019) 'Amorphous InGaZnO and metal oxide semiconductor devices: an overview and current status.', Journal of materials chemistry C., 7 (40). pp. 12388-12414, published on Sep. 27, 2019.
(Continued)

*Primary Examiner* — Vincent Wall
(74) *Attorney, Agent, or Firm* — Eschweiler & Potashnik, LLC

(57) ABSTRACT

The present disclosure relates a ferroelectric field-effect transistor (FeFET) device. In some embodiments, the FeFET device includes a ferroelectric layer having a first side and a second side opposite to the first side and a gate electrode disposed along the first side of the ferroelectric layer. The FeFET device further includes an OS channel layer disposed along the second side of the ferroelectric layer opposite to the first side and a pair of source/drain regions disposed on opposite sides of the OS channel layer. The FeFET device further includes a 2D contacting layer disposed along the OS channel layer. The OS channel layer has a first doping type, and the 2D contacting layer has a second doping type different than the first doping type.

20 Claims, 12 Drawing Sheets

(51) Int. Cl.
  *H01L 21/443* (2006.01)
  *H01L 29/24* (2006.01)
  *H01L 29/45* (2006.01)
  *H01L 29/66* (2006.01)
  *H01L 29/786* (2006.01)
  *H10B 51/30* (2023.01)

(52) U.S. Cl.
  CPC .............. *H01L 29/24* (2013.01); *H01L 29/45* (2013.01); *H01L 29/66969* (2013.01); *H01L 29/7869* (2013.01); *H10B 51/30* (2023.02)

(56) References Cited

U.S. PATENT DOCUMENTS

| | | | |
|---|---|---|---|
| 2006/0118844 A1 | 6/2006 | Kijima et al. | |
| 2009/0294772 A1* | 12/2009 | Jeong | H01L 29/78618 257/66 |
| 2010/0243994 A1 | 9/2010 | Yoon et al. | |
| 2015/0318401 A1 | 11/2015 | Duan et al. | |
| 2016/0056301 A1 | 2/2016 | Lee | |
| 2018/0166448 A1 | 6/2018 | Cheng et al. | |
| 2018/0226248 A1* | 8/2018 | Jahangir | H01L 29/66742 |
| 2018/0358475 A1 | 12/2018 | Guo et al. | |
| 2019/0066750 A1 | 2/2019 | Ding et al. | |
| 2019/0198638 A1 | 6/2019 | Van Houdt et al. | |
| 2020/0066917 A1 | 2/2020 | Kula et al. | |
| 2020/0144293 A1 | 5/2020 | Majhi et al. | |
| 2020/0176610 A1 | 6/2020 | Lee et al. | |
| 2020/0303417 A1* | 9/2020 | Teo | H01L 27/11585 |
| 2020/0388685 A1* | 12/2020 | Sharma | H01L 29/66795 |
| 2020/0411692 A1* | 12/2020 | Dewey | H01L 21/823807 |
| 2020/0411697 A1 | 12/2020 | Ku et al. | |
| 2021/0391355 A1 | 12/2021 | Lill et al. | |

OTHER PUBLICATIONS

Troughton et al. "Amorphous InGaZnO and Metal Oxide Semiconductor Devices: An Overview and Current Status." J. Mater. Chem. C, 2019, 7, 12388, published on Sep. 27, 2019.
Egesse et al. "Tunable High Workfunction Contacts: Doped Graphene." Applied Surface Science 509 (2020) 144893, published on Dec. 2, 2019.

* cited by examiner

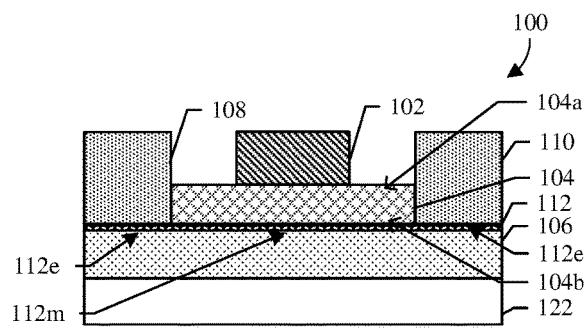
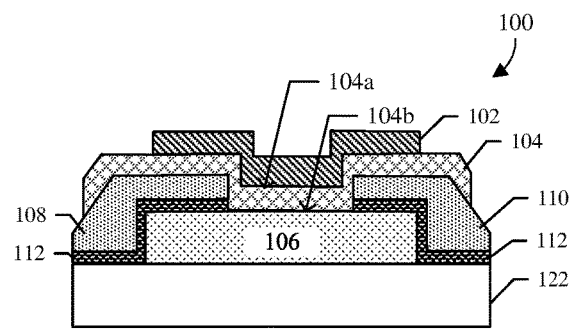
Fig. 3　　　　　　　　　　Fig. 4
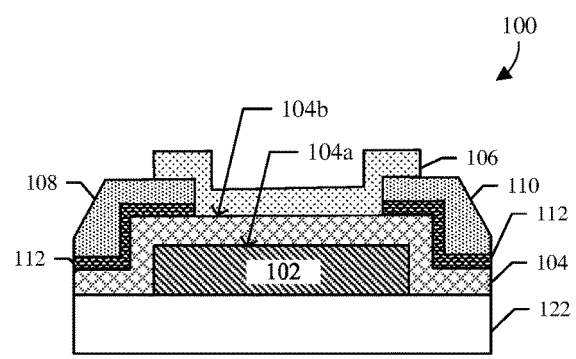
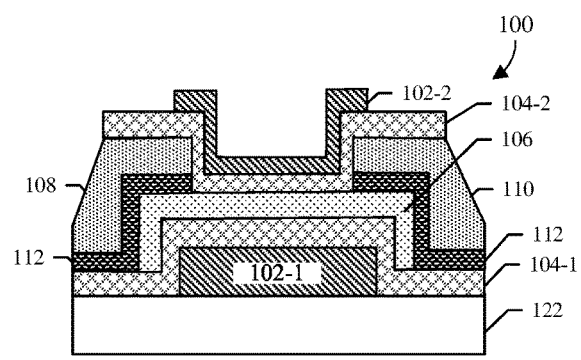
Fig. 5　　　　　　　　　　Fig. 6

TWO-DIMENSIONAL (2D) MATERIAL FOR OXIDE SEMICONDUCTOR (OS) FERROELECTRIC FIELD-EFFECT TRANSISTOR (FEFET) DEVICE

REFERENCE TO RELATED APPLICATION

This Application claims the benefit of U.S. Provisional Application No. 63/143,056, filed on Jan. 29, 2021, the contents of which are hereby incorporated by reference in their entirety.

BACKGROUND

A ferroelectric field-effect transistor (FeFET) is a type of field-effect transistor that includes a ferroelectric material sandwiched between the gate electrode and source-drain conduction region of the device (the channel). Permanent electrical field polarisation in the ferroelectric causes this type of device to retain the transistor's state (on or off) in the absence of any electrical bias and thus can be used as non-volatile memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-6 illustrates cross-sectional views of some additional embodiments of a FeFET device having a 2D contacting layer disposed along an OS channel layer.

DETAILED DESCRIPTION

Figure 1:
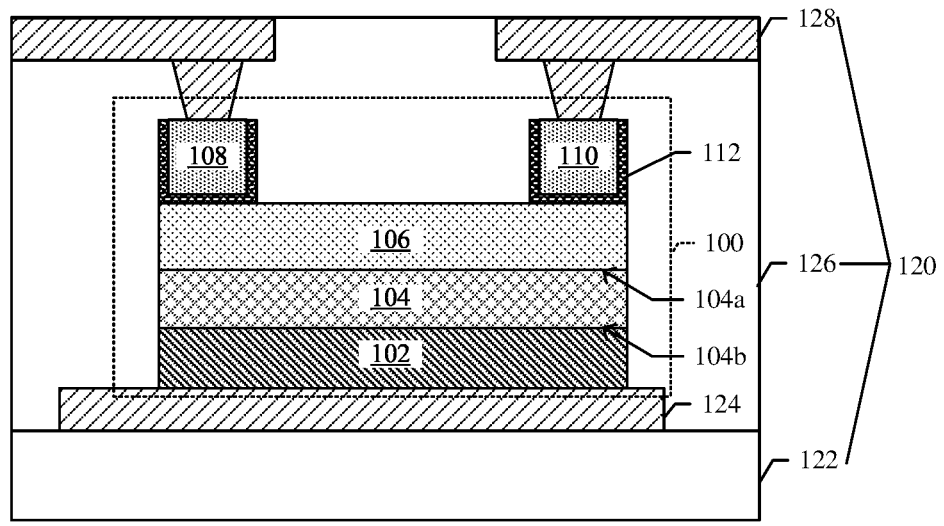
FIG. 1 illustrates a cross-sectional view of some embodiments of a ferroelectric field-effect transistor (FeFET) device having a two-dimensional (2D) contacting layer disposed along an oxide semiconductor (OS) channel layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. However, features described in one figure may be incorporated into embodiments described associated with another figure as additional embodiments when applicable and may not be repeated from simplicity reason.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric field-effect transistors (FeFETs) are used for advanced electronic devices including logic and memory components due to its low operation power. During operation of a FeFET device, an application of a gate voltage to the gate electrode will generate an electric field that causes a dipole moment to form within the ferroelectric material. Depending on a value of the gate voltage, a direction of the dipole moment (i.e., a polarization) may be in one of two opposing directions. Since a threshold voltage (e.g., a minimum gate-to-source voltage that forms a conductive path between the source region and the drain region) of a FeFET device is dependent upon the polarization within the ferroelectric material, the different polarizations effectively split the threshold voltage of the FeFET device into two distinct values corresponding to different data states.

For example, in a p-type FeFET (e.g., a FeFET device using holes as majority carriers between the source region and the drain region and having a channel/substrate region with an n-type doping,) a positive gate voltage will form an electric field that gives a ferroelectric material a first polarization pointing towards the channel region and that causes electrons to accumulate within the channel region. The electrons will reinforce the first polarization within the ferroelectric material and give the FeFET device a first threshold voltage corresponding to a first data state (e.g., a logical "1"). Alternatively, a negative gate voltage will form an electric field that gives the ferroelectric material a second polarization pointing towards the gate electrode and that causes holes to accumulate within the channel region. The holes will reinforce the second polarization within the ferroelectric material and give the FeFET device a second threshold voltage corresponding to a second data state (e.g., a logical "0"). The difference between the first threshold value and the second threshold value defines a memory window of the FeFET device (e.g., corresponding to a difference of threshold voltages of the first and second data states). Permanent electrical field polarization in the ferroelectric material causes the FeFET device to retain the data states in the absence of any electrical bias. Thus, the FeFET device can be used as a unit cell of a random access non-volatile memory.

One direction to advance more flexible integration schemes is to insert memory into an interconnect structure such as back-end-of-line (BEOL) to expand application for non-volatile memory-in-logic solutions. In this case, a low-leakage oxide semiconductor (OS) material can be used for the channel region of the FeFET non-volatile memory. However, the OS material is short of large numbers of different types of charge carriers (holes and electrons). For example, while a channel region comprising an n-type OS channel layer can accumulate electrons to reinforce the first polarization within a ferroelectric material when a positive gate voltage is applied to a gate electrode, the n-type OS channel layer has few positive charges and thus cannot accumulate holes to reinforce the second polarization opposite to the first polarization within the ferroelectric material when a negative gate voltage is applied to the gate electrode. When the negative gate voltage is removed, the ferroelectric material will revert to a remnant polarization and result in an unsuccessful data switching and state retention.

In view of the above, the present disclosure, in some embodiments, relates to a FeFET device comprising a two-dimensional (2D) contacting layer disposed along an OS channel layer and associated manufacturing methods. The FeFET device can be used as a unit cell of a non-volatile memory. The OS channel layer reinforces a first polarization state of the ferroelectric material. The 2D contacting layer provides supplemental charge carriers and thus to reinforce a second polarization state of the ferroelectric material. Thus the FeFET device can have successful data switching and state retention for both data states by the reinforcement of the OS channel layer and the 2D contacting layer. In some embodiments, the FeFET device comprises a gate electrode arranged along a first side of a ferroelectric layer and an OS channel layer disposed along a second side of the ferroelectric layer opposite to the first side. The OS channel layer has a first doping type (e.g., an n-type semiconductor.) A pair of source/drain regions is disposed on opposite sides of the OS channel layer. A 2D contacting layer is disposed along the OS channel layer and has a second doping type different than the first doping type (e.g., a p-type semiconductor.) During operation, a writing voltage is applied to the gate electrode to generate an electric field that polarizes the ferroelectric layer. When the electric field causes the ferroelectric layer to have a first polarization with a first direction, a first type of charge carriers accumulates within the OS channel layer and enhance and/or reinforce the first polarization. When the electric field causes the ferroelectric layer to have a second polarization with a second direction, a second type of charge carriers within the 2D contacting layer will operate to enhance and/or reinforce the second polarization. Thus, by having the 2D contacting layer disposed along the OS channel layer, polarization switching of the ferroelectric layer between different data states is further enhanced and/or reinforced. In some embodiments, the 2D contacting layer is heavily doped at least in part and disposed between the source/drain regions and the OS channel layer and thus also helps to reduce contact resistance of the source/drain regions.

FIG. 1 illustrates a cross-sectional view of a FeFET device 100 according to some embodiments. The FeFET device 100 is disposed over a substrate 122 and may be incorporated within an interconnect structure 120. The FeFET device 100 comprises a ferroelectric layer 104 having a first side 104a and a second side 104b. An OS channel layer 106 is arranged along the first side 104a of the ferroelectric layer 104. A gate electrode 102 is arranged along the second side 104b of the ferroelectric layer 104. A pair of source/drain regions 108, 110 is arranged on opposite ends of the OS channel layer 106. A 2D contacting layer 112 is disposed along the OS channel layer 106. In some embodiments, the OS channel layer 106 is of a first doping type (e.g. no-type) while the 2D contacting layer 112 is of second doping type (e.g., p-type.) The OS channel layer 106 provides carrier charges of a first type (e.g. electrons) to reinforce a first polarization state of the ferroelectric layer 104 to help achieve successful data programing and state retention of a first data state (e.g. data state "1".) The 2D contacting layer 112 provides carrier charges of a second type (e.g. holes) supplemental to those provided by the OS channel layer 106, and thus reinforces a second polarization state of the ferroelectric layer 104 to help achieve successful data programing and state retention of a second data state (e.g. data state "0".) An example of more detailed operation is given below associated with FIGS. 8A-8C below.

In some embodiments, the 2D contacting layer 112 is disposed on an upper surface of the OS channel layer 106. In some embodiments, the 2D contacting layer 112 is disposed between and contacting bottom surfaces of the pair of source/drain regions 108, 110 and an upper surface of the OS channel layer 106. Thus, the 2D contacting layer 112 also lowers the contact resistance between the source/drain regions 108, 110 and the OS channel layer 106. In some embodiments, the 2D contacting layer 112 covers bottom and sidewall surfaces of the pair of source/drain regions 108, 110 and is absent from a middle region of the OS channel layer 106 between the pair of source/drain regions 108, 110.

In some embodiments, the ferroelectric layer 104 is or is comprised of a material having dielectric crystals which exhibit an electric polarization having a direction that can be controlled by an electric field. For example, in some embodiments, the ferroelectric layer 104 may comprise hafnium-oxide ($HfO_2$), hafnium zinc oxide ($HfZnO_2$), or the like. In some embodiments, the OS channel layer 106 is or is comprised of an n-type oxide semiconductor material such as indium gallium zinc oxide (IGZO) or gallium oxide ($Ga_2O_3$) having free electrons outnumbering holes. In some embodiments, the 2D contacting layer 112 is or is comprised of a monolayer or multilayer two-dimensional material that is crystalline solids consisting of a single layer of atoms. The two-dimensional material is derived from single element or compounds of two or more elements. For example, the 2D contacting layer 112 may comprise a p-type single element two-dimensional material such as graphene, borophene or compound two-dimensional material such as molybdenum disulfide ($MoS_2$), molybdenum diselenide ($MoSe_2$), molybdenum ditelluride ($MoTe_2$), or other transition metal dichalcogenides (TMDs) having holes outnumbering free electrons. In other embodiments, the OS channel layer 106 is or is comprised of a p-type doped semiconductor or oxide semiconductor while the 2D contacting layer 112 is or is comprised of an n-type doped material. Using the two-dimensional materials for the 2D contacting layer 112 is beneficial since work functions of the two-dimensional materials can be precisely engineered to achieve desired n or p type material and can be obtained either by direct growth with specific conditions or by implantation processes.

In some embodiments, the OS channel layer 106 may have a doping concentration in a range of approximately $1\times10^{16}$ at/$cm^3$ to approximately $1\times10^{18}$ at/$cm^3$. The 2D contacting layer 112 may have doping concentrations that are in a range of between approximately $1\times10^{18}$ at/$cm^3$ and approximately $1\times10^{21}$ at/$cm^3$. The source/drain regions 108, 110 may have doping concentrations that are in a range of between approximately $1\times10^{18}$ at/$cm^3$ and approximately $1\times10^{20}$ at/$cm^3$. In some embodiments, the ferroelectric layer 104 may have a thickness that is in a range of between approximately 1 nanometers (nm) and approximately 15 nm. The source/drain regions 108, 110 may respectively have a thickness that is in a range of between approximately 10 nm and approximately 50 nm. In some embodiments, the OS channel layer 106 may have a thickness that is in a range of between approximately 3 nm and approximately 20 nm. In some embodiments, the 2D contacting layer 112 may have a thickness that is in a range of between approximately 0.1 nm and approximately 5 nm. The thickness and/or doping concentration of the 2D contacting layer 112 and/or the OS channel layer 106 provide for good on-off modulation of the FeFET device and mitigate a channel current from flowing through the 2D contacting layer 112.

In some embodiments, the interconnect structure 120 comprises a lower metal layer 124 disposed below the FeFET device 100, an upper metal layer 128 disposed above the FeFET device 100, and a dielectric layer 126 surrounding the FeFET device 100. In some embodiments, the gate electrode 102 directly contacts to or is electrically coupled to a metal line of the lower metal layer 124. The gate electrode 102 is or is comprised of a conductive material such as titanium, titanium nitride, tungsten, tungsten nitride, copper, gold, zinc, aluminum, or the like. The ferroelectric layer 104 may be disposed over or directly on the gate electrode 102. The OS channel layer 106 may be disposed over or directly on the ferroelectric layer 104. In some embodiments, the source/drain regions 108, 110 directly contact or are electrically coupled to respective metal line of the upper metal layer 128 through contacts, vias and/or other intermediate metal lines. The source/drain regions 108, 110 are or are comprised of a metal, such as titanium, titanium nitride, tungsten, tungsten nitride, copper, gold, zinc, aluminum, or the like. Sidewalls of the source/drain regions 108, 110 may be separated from the dielectric layer 126 by the 2D contacting layer 112. The dielectric layer 126 is or is comprised of a stack of one or more dielectric materials such as an oxide (e.g., silicon oxide, silicon dioxide, etc.), a nitride (e.g., silicon nitride), a carbide (e.g., silicon carbide), or the like. Alternatively, the FeFET device 100 can be a front-end-of-line (FEOL) transistor or memory cell disposed on the substrate 122. The source/drain regions 108, 110 may be electrically coupled to a bit-line and a source-line of a memory array, and the gate electrode 102 may be electrically coupled to a word-line of the memory array.

Figure 2:
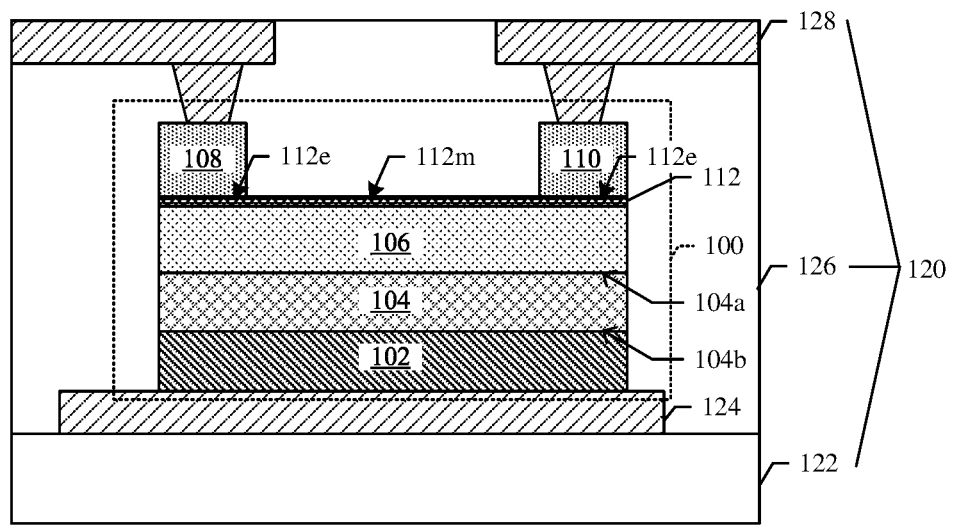
FIG. 2 illustrates a cross-sectional view of some additional embodiments of a FeFET device having a 2D contacting layer disposed along an OS channel layer.

FIG. 2 illustrates a cross-sectional view of the FeFET device 100 according to some additional embodiments. Some features of the FeFET device 100 similar to the FeFET device 100 shown in FIG. 1 are incorporated herein and not repeated. As further shown in FIG. 2, in some embodiments, the 2D contacting layer 112 is disposed between and contacting lateral surfaces of the OS channel layer 106 and the source/drain regions 108, 110. The 2D contacting layer 112 may cover a top surface of the OS channel layer 106. The 2D contacting layer 112 may be absent from the sidewalls of the source/drain regions 108, 110. In some embodiments, ending portions 112e of the 2D contacting layer 112 underlying the source/drain regions 108, 110 are more heavily doped than a middle portion 112m of the 2D contacting layer 112 between the source/drain regions 108, 110. Thus, the ending portions 112e of the 2D contacting layer 112 help to lower source/drain contact resistance while the middle portion 112m of the 2D contacting layer is resistive and not shorting the OS channel layer 106. For example, ending portions 112e of the 2D contacting layer 112 may have doping concentrations that are in a range of between approximately $1 \times 10^{18}$ at/cm$^3$ and approximately $1 \times 10^{21}$ at/cm$^3$ while the middle portion 112m of the 2D contacting layer may have doping concentrations that are in a range of between approximately $1 \times 10^{16}$ at/cm$^3$ and approximately $1 \times 10^{18}$ at/cm$^3$.

In some alternative embodiments not shown in figures, the 2D contacting layer 112 is disposed between the OS channel layer 106 and the ferroelectric layer 104. In this case, as an example, the 2D contacting layer 112 may have doping concentrations that are in a range of between approximately $1 \times 10^{16}$ at/cm$^3$ and approximately $1 \times 10^{18}$ at/cm$^3$.

It is appreciated that though FIG. 1 and FIG. 2 provide some embodiments of the FeFET device 100 comprising the 2D contacting layer 112 disposed along the OS channel layer 106, the FeFET device structures are not limited to what are shown in FIG. 1 and FIG. 2 regarding to positions of the gate electrode 102 and the source/drain regions 108, 110. FIGS. 3-6 provide additional examples of various device architectures with different locations of the gate electrode 102 and the source/drain regions 108, 110. Other device architectures with varied shapes and locations of gate electrode and source/drain regions (e.g., FinFET, GAA (gate-all-around), nanostructures, nanosheet, nanowire, etc.) are also amenable. For simplicity reason, contacts and interconnect structures are not shown in FIGS. 3-6, but the FeFET device 100 can be a front-end-of-line (FEOL) transistor or memory cell disposed on the substrate 122 or a transistor or memory cell of a random access memory inserted within a back-end-of-line (BEOL) interconnect structure.

As shown in FIG. 3, the FeFET device 100 may be a top gate device where the gate electrode 102 is at least in-part laterally between the source/drain regions 108, 110. In some embodiments, the ferroelectric layer 104 is arranged between opposing sidewalls of the source/drain regions 108, 110. The ferroelectric layer 104 may directly contact the opposing sidewalls of the source/drain regions 108, 110. In some embodiments, the 2D contacting layer 112 is disposed between and contacting the ferroelectric layer 104 and the OS channel layer 106. The 2D contacting layer 112 may cover lateral surfaces of the ferroelectric layer 104 and the OS channel layer 106. The source/drain regions 108, 110 may have bottom surfaces covered by the 2D contacting layer 112. In some embodiments, ending portions 112e of the 2D contacting layer 112 underlying the source/drain regions 108, 110 are more heavily doped than a middle portion 112m of the 2D contacting layer 112 between the source/drain regions 108, 110. Thus, the ending portions 112e of the 2D contacting layer 112 help to lower source/drain contact resistance while the middle portion 112m of the 2D contacting layer is resistive and not shorting the OS channel layer 106. In some embodiments, ending portions 112e of the 2D contacting layer 112 underlying the source/drain regions 108, 110 are more heavily doped than a middle portion 112m of the 2D contacting layer 112 underlying ferroelectric layer 104. Thus, the ending portions 112e of the 2D contacting layer 112 help to lower source/drain contact resistance while the middle portion 112m of the 2D contacting layer is resistive and not shorting the OS channel layer 106. For example, ending portions 112e of the 2D contacting layer 112 may have doping concentrations that are in a range of between approximately $1 \times 10^{18}$ at/cm$^3$ and approximately $1 \times 10^{21}$ at/cm$^3$ while the middle portion 112m of the 2D contacting layer may have doping concentrations that are in a range of between approximately $1 \times 10^{16}$ at/cm$^3$ and approximately $1 \times 10^{18}$ at/cm$^3$.

As shown in FIG. 4, the FeFET device 100 may have source/drain regions 108, 110 comprising a lower lateral portion and an upper lateral portion connected by a vertical portion. The vertical portion of the source/drain regions 108, 110 may be disposed along a sidewall of the OS channel layer 106, and the upper portion of the source/drain regions 108, 110 may be disposed along an upper surface of the OS channel layer 106. The 2D contacting layer 112 may be arranged in conformal between and contacting a lower surface of the source/drain regions 108, 110 and the sidewall and upper surface of the OS channel layer 106. The ferroelectric layer 104 may be arranged on a middle portion of the upper surface of the OS channel layer 106 not covered by the 2D contacting layer 112 and/or the source/drain regions 108, 110. The ferroelectric layer 104 may contact sidewalls of the 2D contacting layer 112 and the source/drain regions 108, 110 and may further extend over upper surfaces of the source/drain regions 108, 110. The gate electrode 102 may be disposed over the ferroelectric layer 104 and may also laterally extend above the source/drain regions 108, 110.

As shown in FIG. 5, the 2D contacting layer 112 may be conformally disposed along and contacting a lower lateral surface and an upper lateral surface of the ferroelectric layer 104 connected by a vertical sidewall of the ferroelectric layer 104. The OS channel layer 106 may be disposed on the ferroelectric layer 104 and having sidewalls contacting sidewalls of the 2D contacting layer 112 and the source/drain regions 108, 110. The OS channel layer 106 may further extend over an upper surface of the source/drain regions 108, 110.

As shown in FIG. 6, the FeFET device 100 may have additional device features such as double gate electrodes 102-1, 102-2 disposed at opposite sides of the OS channel layer 106. A first ferroelectric layer 104-1 and a second ferroelectric layer 104-2 may respectively disposed between and separating the OS channel layer 106 and the double gate electrodes 102-1, 102-2. The 2D contacting layer 112 may be conformally disposed along and contacting a lower lateral surface of the first ferroelectric layer 104-1 and an upper lateral surface of the OS channel layer 106 connected by a vertical sidewall of the OS channel layer 106.

Figure 7:
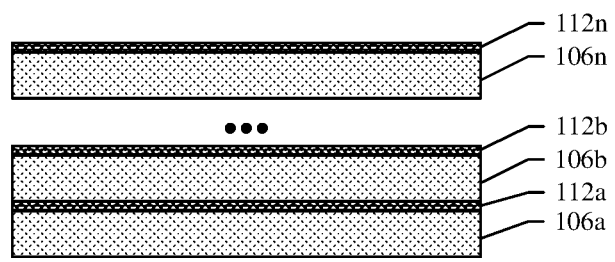
FIG. 7 illustrates a schematic diagram of some embodiments of a stack of 2D contacting layers and OS channel layers for a FeFET device.

FIG. 7 illustrates a schematic diagram of a stack of 2D contacting layers 112a, 112b, . . . , 112n and OS channel layers 106a, 106b, . . . , 106n for a FeFET device according to some embodiments. Alternative to having a 2D contacting layer disposed along one side of an OS channel layer, one or more 2D contacting layers may be arranged on both sides of the OS channel layer or inserted within a stack of OS channel layers. The 2D contacting layers provide supplemental carrier charges (e.g. holes) different from major carrier charges (e.g. electrons) of the OS channel layers to help achieve successful data programing and state retention of both data states (e.g. data state "0" and data state "1".)

Figure 8A:
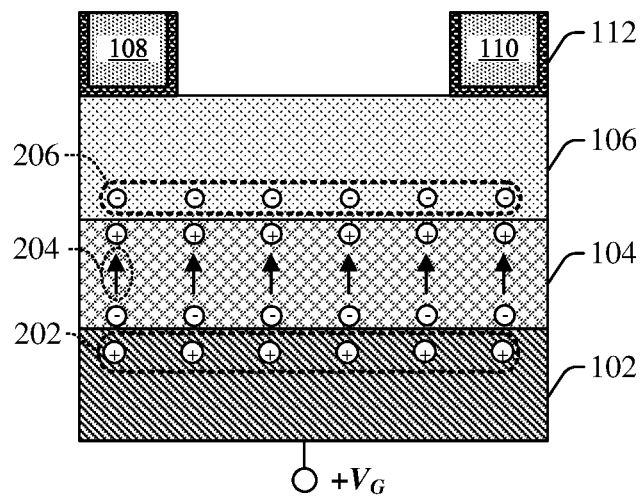
FIGS. 8A-8C illustrate schematic diagrams of some embodiments of operations of a FeFET device having a 2D contacting layer disposed along an OS channel layer.
Figure 8B:
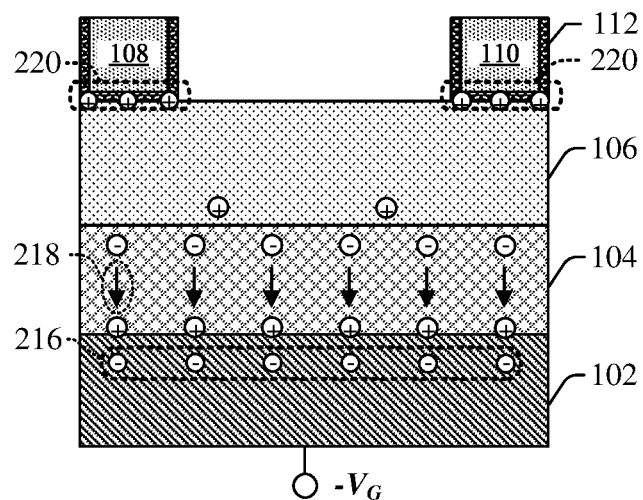

FIGS. 8A-8B illustrate schematic diagrams of operations of a p-type FeFET device comprising a 2D contacting layer 112 disposed along an OS channel layer 106 according to some embodiments. The p-type FeFET device uses holes as majority carriers flown between the source/drain regions 108, 110 and comprises an n-type doping channel/substrate region. The p-type FeFET device comprises a ferroelectric layer 104 arranged between a gate electrode 102 and an OS channel layer 106 of an n-type oxide semiconductor. The source/drain regions 108, 110 is arranged on opposite ends of the OS channel layer 106. The 2D contacting layer 112 is arranged along the OS channel layer 106 and comprises a p-type two-dimensional material. Though a device structure of a back-gate FeFET structure of a 2D contacting layer covering bottom and sidewall surfaces of the source/drain regions 108, 110 (a structure similar to FIG. 1) is used for the illustration of FIGS. 8A-8B, it is appreciated that other FeFET structures, such as FeFET structures similar to FIGS. 2-6, can operate in a similar way. It is also appreciated that an n-type FeFET structure also has a similar operation principle but with opposite charge types.

As shown in the cross-sectional view of FIG. 8A, a positive gate voltage $V_G$ is applied to the gate electrode 102. The positive gate voltage $V_G$ causes positive charge carriers 202 (i.e., holes) to accumulate upon a surface of the gate electrode 102 facing the ferroelectric layer 104. The positive charge carriers 202 form an electric field that causes the ferroelectric layer 104 to be polarized to a first polarization 204. The electric field further causes a build-up of negative charge carriers 206 within the OS channel layer 106. The negative charge carriers 206 reinforce the first polarization 204 within the ferroelectric layer 104, thereby giving the FeFET device a first threshold voltage. The first polarization 204 is retained within the ferroelectric layer 104 even when the positive gate voltage $V_G$ is removed, and so is the first threshold voltage. Thus, the p-type FeFET device is programed to a first data state (e.g., a logical "1".)

As shown in cross-sectional view of FIG. 8B, a negative gate voltage $-V_G$ is applied to the gate electrode 102. The negative gate voltage $-V_G$ causes negative charge carriers 216 to accumulate along a surface of the gate electrode 102 facing the ferroelectric layer 104. The negative charge carriers 216 form an electric field that causes the ferroelectric layer 104 to be polarized to a second polarization 218. The n-type oxide semiconductor material of the OS channel layer 106 lacks positive charge carriers and thus cannot sufficiently reinforce the second polarization 218 within the ferroelectric layer 104. If absent of the 2D contacting layer 112, the second polarization 218 cannot be effectively maintained when the negative gate voltage $-V_G$ is removed.

Responding to the second polarization 218, the 2D contacting layer 112 provides positive charge carriers 220 accumulating along the bottom of the 2D contacting layer 112 facing the OS channel layer 106. The positive charge carriers 220 reinforce the second polarization 218 within the ferroelectric layer 104, thereby helps to maintain a second threshold voltage for the FeFET device even when the negative gate voltage $-V_G$ is removed. Thus, the p-type FeFET device is programed to a second data state (e.g., a logical "0".)

Polarization status of the ferroelectric layer 104 can be measured by a conductance in the p-type FeFET device channel. During a reading operation, a drain voltage is applied between the source/drain regions 108, 110. A reading gate voltage is applied to the gate electrode 102. The reading gate voltage may be between the first threshold voltage of the first data state and the second threshold voltage of the second data state, such that the reading gate voltage would turn on the p-type FeFET in one of the data state but not the other. Thus, the data state can be read through drain current flowing between the source/drain regions 108, 110.

Figure 8C:
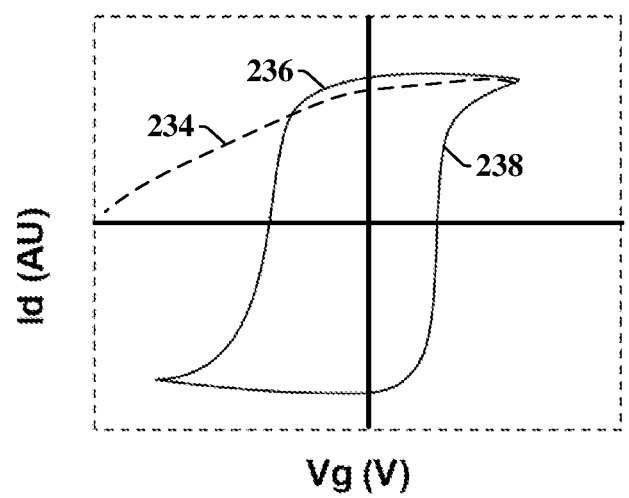

FIG. 8C illustrates a schematic diagram showing an exemplary Id-Vg programing curve of a FeFET device. Illustrated by line 238 is a drain current in response to a positive gate voltage $V_G$ of a first programing process as described above associated with FIG. 8A. The FeFET device will have a first threshold voltage when a ferroelectric layer of the FeFET device has a first polarization. Negative charge carriers within the OS channel layer reinforce the first polarization within the ferroelectric layer even when the positive gate voltage $V_G$ is removed. Thus, the FeFET device is storing a first data state (e.g., a logical "1".) Illustrated by line 236 is a drain current in response to a negative gate voltage $-V_G$ of a second programing process or an erase process of the first programming process as described above associated with FIG. 8B. The FeFET device will have a second threshold voltage when a ferroelectric layer of the FeFET device has a second polarization. Positive charge carriers within the 2D contacting layer reinforce the second polarization within the ferroelectric layer even when the negative gate voltage $-V_G$ is removed. Thus, the FeFET device is erased from the first data state or stored with a second data state (e.g., a logical "0".) As illustrated by line 234, for comparison, for a FeFET device absent of the 2D contacting layer disposed along an OS channel layer, a drain current in response to a negative gate voltage $-V_G$ may not achieve or maintain the second polarization within the ferroelectric layer. Thus, the FeFET device may fail to erase the first state or to program the second state.

FIGS. 9-16 illustrate cross-sectional views 900-1600 of some embodiments of a method of forming a back-gate FeFET device having a 2D contacting layer disposed along an OS channel layer. Although FIGS. 9-16 are described in relation to a method, it will be appreciated that the structures disclosed in FIGS. 9-16 are not limited to such a method, but instead may stand alone as structures independent of the method.

Figure 9:
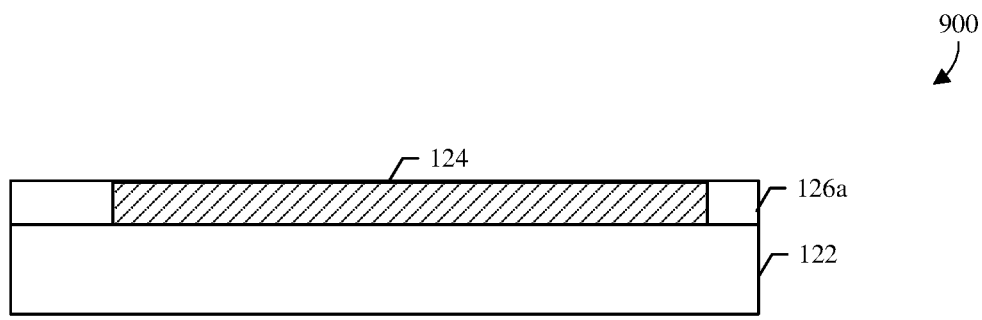
FIGS. 9-26 illustrate cross-sectional views of some embodiments of methods of forming an integrated chip comprising a FeFET device having a 2D contacting layer disposed along an OS channel layer.

As shown in cross-sectional view 900 of FIG. 9, a substrate 122 is provided. In various embodiments, the substrate 122 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, various FEOL devices are formed in the substrate 122 followed by forming middle-of-line (MOL) contacts and one or more metal layers of a BEOL interconnect structure. For example, metal layers know as M0, M1, M2 . . . etc. can be formed overlying the FEOL devices on the substrate 122. In some embodiments, a lower metal layer 124 and a first dielectric layer 126a surrounding the lower metal layer 124 are formed over the substrate 122. In some embodiments, the lower metal layer 124 may be formed by way of a damascene process (e.g., a single damascene process or a dual damascene process), where a patterning process is performed to form trenches and/or via holes in the first dielectric layer 126a followed by a metal filling process. The lower metal layer 124 may be one of the metal layers of the BEOL interconnect structure.

Figure 10:
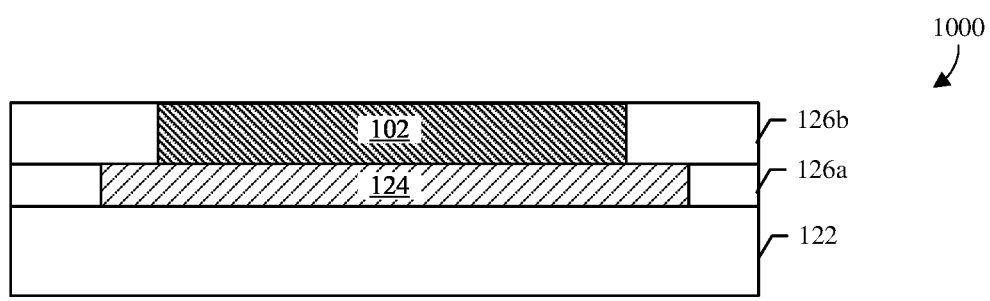

As shown in cross-sectional view 1000 of FIG. 10, a gate electrode 102 and a second dielectric layer 126b surrounding the gate electrode 102 are formed over the substrate 122. In some embodiments, the gate electrode 102 is formed directly on a metal line of the lower metal layer 124. In various embodiments, the gate electrode 102 may be formed by way of one or more deposition processes (e.g., ALD processes, CVD processes, PE-CVD processes, PVD processes, or the like) followed by a patterning process. The gate electrode 102 may comprise one or more conductive materials. In some embodiments, the one or more conductive materials may comprise and/or be a metal such as titanium, titanium nitride, tungsten, tungsten nitride, copper, gold, zinc, aluminum, or the like. A deposition process is then performed to form the second dielectric layer 126b followed by a planarization process to remove excessive portion of the second dielectric layer 126b above the gate electrode 102. Alternatively, the gate electrode 102 may also be formed by a damascene process (e.g., a single damascene process or a dual damascene process), where a patterning process is performed to form trenches and/or via holes in the second dielectric layer 126b followed by a metal filling process.

Figure 11:
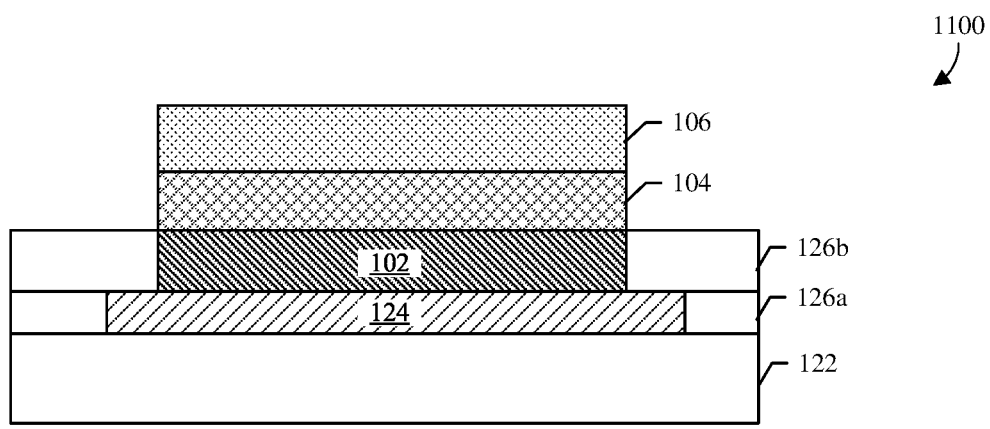

As shown in cross-sectional view 1100 of FIG. 11, a stack of device layers is formed on the gate electrode 102. In some embodiments, a ferroelectric layer 104 may be formed over the gate electrode 102, and an OS channel layer 106 may be formed over the ferroelectric layer 104. The ferroelectric layer 104 and the OS channel layer 106 may be formed by deposition processes s followed by patterning processes. The ferroelectric layer 104 and the OS channel layer 106 may be formed with sidewalls aligned with one another and further aligned with that of the gate electrode 102. In some embodiments, the ferroelectric layer 104 may be formed with one or more ferroelectric materials such as hafnium oxide, hafnium zinc oxide, or the like. In various embodiments, the ferroelectric layer 104 may be formed by way of one or more deposition processes (e.g., ALD processes, CVD processes, PE-CVD processes, PVD processes, or the like). The OS channel layer 106 may be formed with one or more oxide semiconductor materials having a first type of semiconductor (e.g., an n-type semiconductor having electrons as a majority carrier or a p-type semiconductor having holes as a majority carrier). In some embodiments, the one or more oxide semiconductor materials may comprise one or more n-type oxide semiconductors, such as indium gallium zinc oxide (IGZO), indium gallium zinc tin oxide (IGZTO), indium tungsten oxide (IWO), indium tungsten zinc oxide (IWZO), indium zinc oxide (IZO), zinc oxide (ZnO), or the like. In other embodiments, the one or more oxide semiconductor materials may comprise one or more p-type oxide semiconductors, such as tin oxide (SnO), nickel oxide (NiO), copper oxide ($Cu_2O$), $NaNbO_2$, or the like. In various embodiments, the OS channel layer 106 may be formed by way of one or more deposition processes (e.g., ALD processes, CVD processes, PE-CVD processes, PVD processes, or the like). In some embodiments, the ferroelectric layer 104, the OS channel layer 106, and the gate electrode 102 are deposited one after another and then patterned at one time, alternative to what is shown in FIG. 10 and FIG. 11 where the ferroelectric layer 104 and the OS channel layer 106 are shown as formed after the formation of the gate electrode 102.

Figure 12:
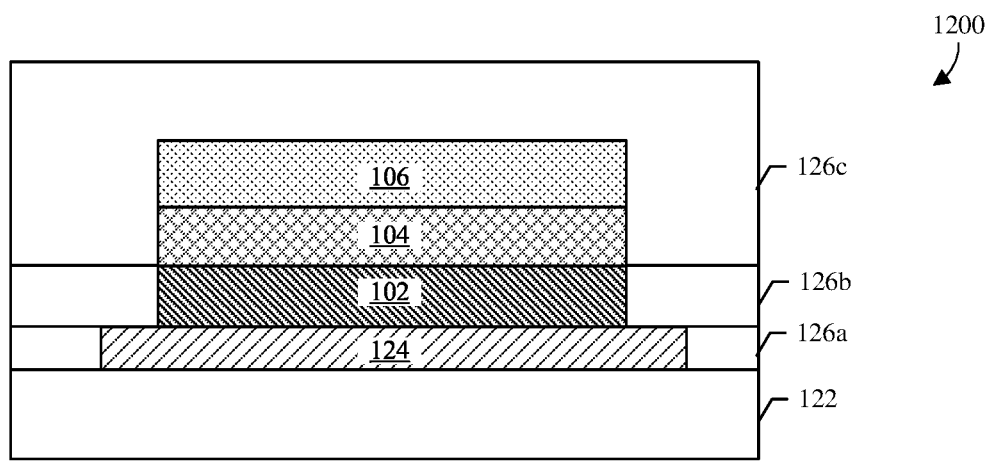

As shown in cross-sectional view 1200 of FIG. 12, a third dielectric layer 126c is formed over the stack of device layers. For example, the third dielectric layer 126c is formed over the second dielectric layer 126b and extends along an upper surface and sidewalls of the stack of device layers. In various embodiments, the third dielectric layer 126c may be formed by way of one or more deposition processes (e.g., ALD processes, CVD processes, PE-CVD processes, PVD processes, or the like) followed by a planarization process. Though not shown in the figure, additional isolation processes may be performed prior to forming the third dielectric layer 126c surrounding the stack of device layers.

Figure 13:
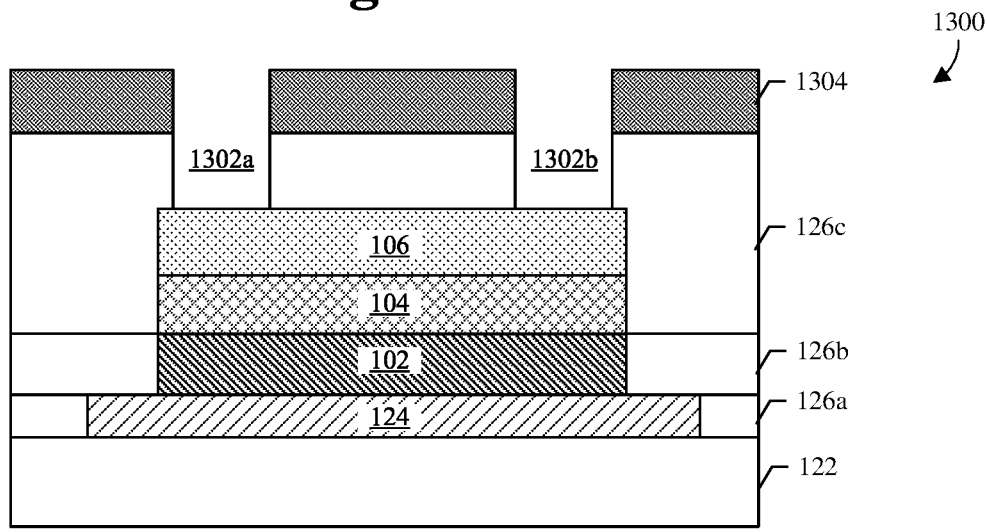

As shown in cross-sectional view 1300 of FIG. 13, source/drain contact holes 1302a, 1302b are formed thorough the third dielectric layer 126c reaching on the stack of device layer. In some embodiments, the source/drain contact holes 1302a, 1302b expose an upper surface of the OS channel layer 106. The source/drain contact holes 1302a, 1302b may be formed by a patterning process performed to pattern the third dielectric layer 126c by selectively exposing the third dielectric layer 126c to an etchant according to a masking layer 1304. The etchant may comprise a dry etchant (e.g., having a fluorine chemistry, a chlorine chemistry, or the like).

Figure 14:
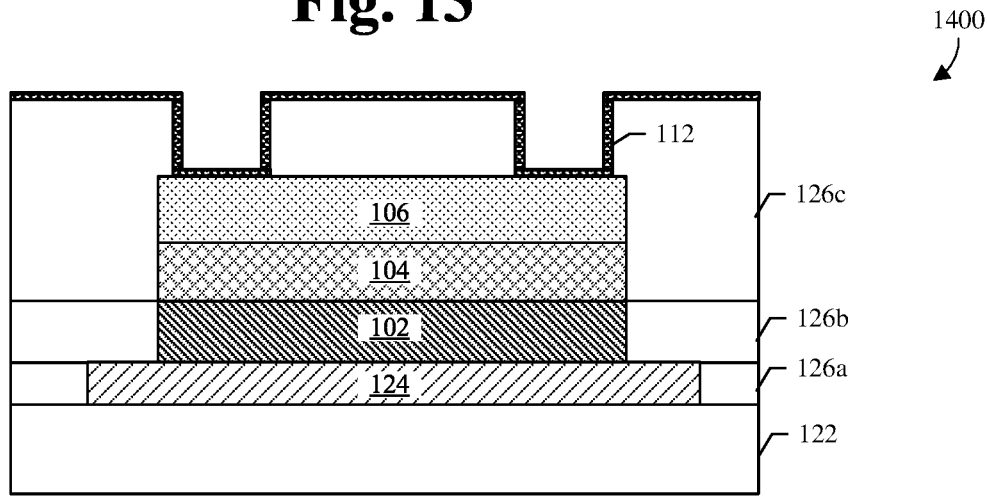

As shown in cross-sectional view 1400 of FIG. 14, in some embodiments, a 2D contacting layer 112 is formed on the exposed surfaces of the stack of device layer. In some embodiments, the 2D contacting layer 112 is formed conformally along the upper surface of the OS channel layer 106, extending along sidewall and lateral surfaces of the third dielectric layer 126c. The 2D contacting layer 112 may be formed with a monolayer or multilayer two-dimensional material that is crystalline solids consisting of a single layer of atoms. The two-dimensional material is derived from single element or compounds of two or more elements. The 2D contacting layer 112 has a second doping type that is different than the first doping type of the OS channel layer 106. For example, the 2D contacting layer 112 may comprise a p-type single element two-dimensional material such as graphene, borophene or compound two-dimensional material such as $MoS_2$, $MoSe_2$, $MoTe_2$, or other transition metal dichalcogenides (TMDs) having holes outnumbering free electrons. In other embodiments, the OS channel layer 106 is formed with a p-type doped semiconductor or oxide semiconductor while the 2D contacting layer 112 is formed with an n-type doped material. In some embodiments, the 2D contacting layer 112 is formed in conformal on the exposed surfaces of the stack of device layer using deposition technique (e.g., ALD processes, CVD processes, PE-CVD processes, or the like). Alternatively, the 2D contacting layer 112 may be formed on a sacrificial substrate and then transferred to the exposed surfaces of the stack of device layer. In some embodiments, the 2D contacting layer 112 may be inherently doped, while in other embodiments the 2D contacting layer 112 may be doped by way of an implantation process.

In some embodiments, alternative to forming the 2D contacting layer 112 in the source/drain contact holes 1302a, 1302b as shown in FIGS. 13-14, the 2D contacting layer 112 may be formed on the OS channel layer 106 prior to the formation of the third dielectric layer 126c. The 2D contacting layer 112 may be deposited or transferred from a sacrificial substrate on the OS channel layer 106 after the deposition of the OS channel layer 106 and prior to the patterning process of the OS channel layer 106. The 2D contacting layer 112 may be then patterned together with the stack of device layers. The 2D contacting layer 112 may be formed to cover the entire top surface of the OS channel layer 106, as shown in FIG. 2.

Figure 15:
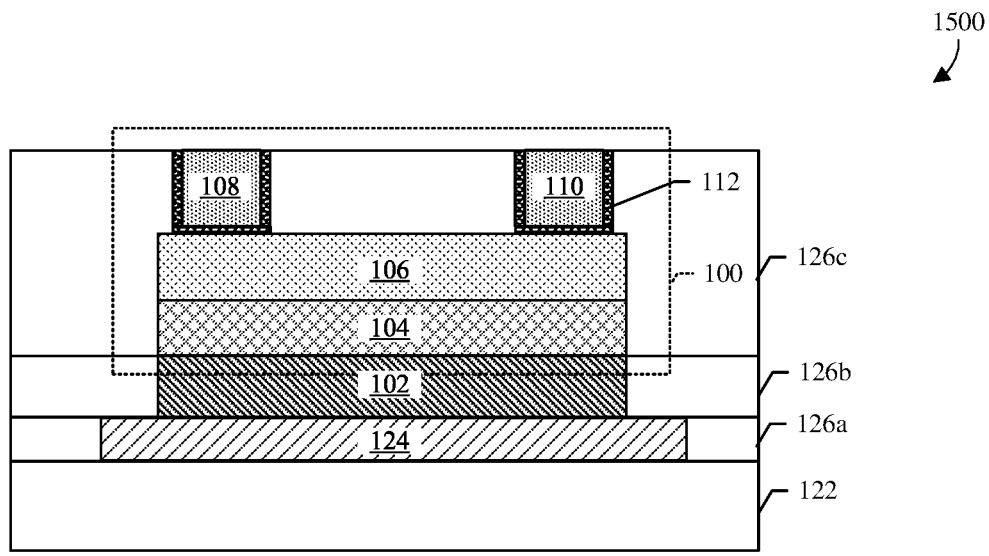

As shown in cross-sectional view 1500 of FIG. 15, a conductive material is formed within the source/drain contact holes 1302a, 1302b (see FIG. 14). In some embodiments, the conductive material may comprise a metal, such as copper, tungsten, cobalt, or the like. In some embodiments the conductive material may be deposited by one or more of a deposition process and a plating process. In some embodiments, a deposition process may be used to form a seed layer of a conductive material followed by a plating process to fill in the source/drain contact holes 1302a, 1302b. In some embodiments, after formation of the conductive material, a planarization process may be performed to remove excess of the conductive material from over the third dielectric layer 126c and to define source/drain regions 108, 110.

Figure 16:
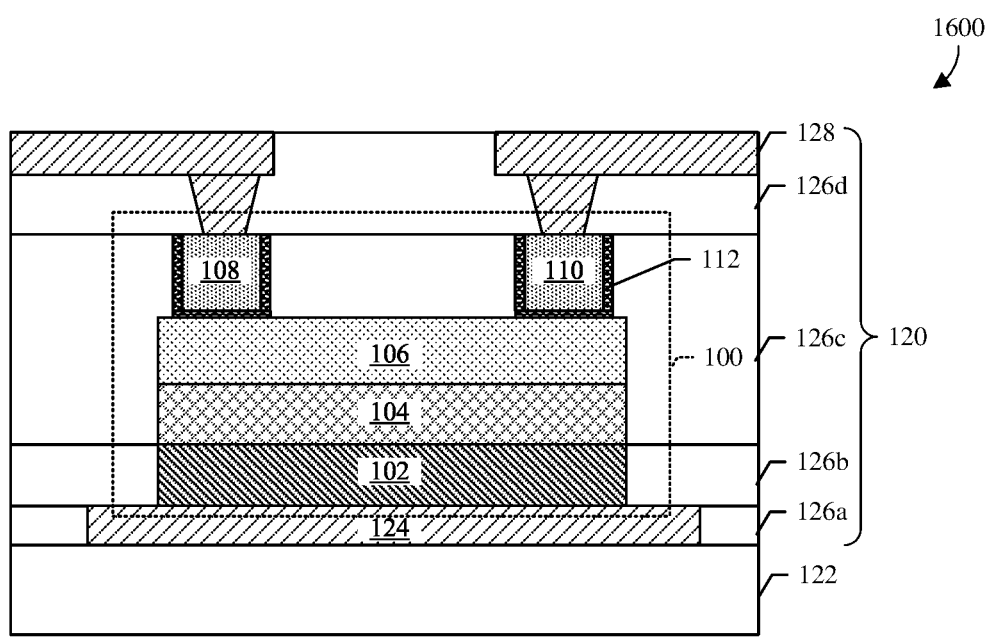

As shown in cross-sectional view 1600 of FIG. 16, a fourth dielectric layer 126d and an upper metal layer 128 is formed over the stack of device layers. The metal layers 124, 128 and the dielectric layers 126a, 126b, 126c, 126d are collectively formed as an interconnect structure 120. The dielectric layers 126a, 126b, 126c, 126d may be respectively formed with one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like. Though not shown in the figures, the dielectric layers 126a, 126b, 126c, 126d may be separated by one or more etch stop layers. The one or more etch stop layers may be formed with a carbide (e.g., silicon carbide, silicon oxycarbide, or the like), a nitride (e.g., silicon nitride, silicon oxynitride, or the like), or the like. The dielectric layers 126a, 126b, 126c, 126d are shown as examples and can be formed as fewer or more layers of dielectric. In some embodiments, the upper metal layer 128 is formed to directly contact or electrically coupled to the source/drain regions 108, 110 through conductive contacts and/or additional metal layers. In some embodiments, the upper metal layer 128 may be formed by way of a damascene process (e.g., a single damascene process or a dual damascene process).

FIGS. 17-26 illustrate cross-sectional views 1700-2600 of some embodiments of a method of forming a FeFET device having a 2D contacting layer disposed along an OS channel layer. Although FIGS. 17-26 are described in relation to a method, it will be appreciated that the structures disclosed in FIGS. 17-26 are not limited to such a method, but instead may stand alone as structures independent of the method.

Figure 17:
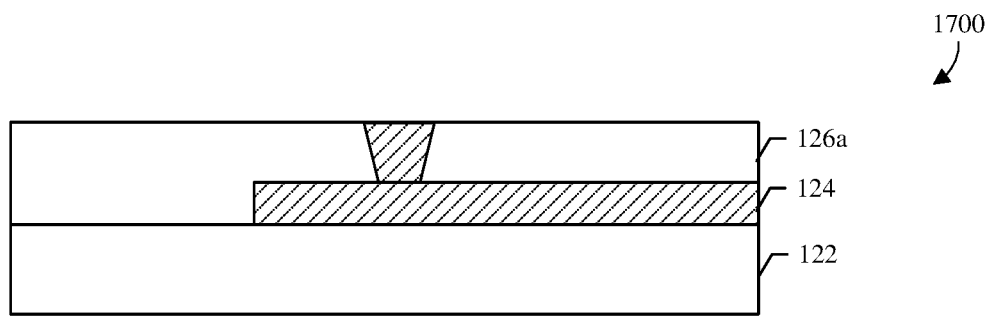

As shown in cross-sectional view 1700 of FIG. 17, a substrate 122 is provided. In various embodiments, the substrate 122 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, various FEOL devices are formed in the substrate 122 followed by forming middle-of-line (MOL) contacts and one or more metal layers of a BEOL interconnect structure. For example, metal layers know as M0, M1, M2 . . . etc. can be formed overlying the FEOL devices on the substrate 122. In some embodiments, a lower metal layer 124 and a first dielectric layer 126a surrounding the lower metal layer 124 are formed over the substrate 122. In some embodiments, the lower metal layer 124 may be formed by way of a damascene process (e.g., a single damascene process or a dual damascene process), where a patterning process is performed to form trenches and/or via holes in the first dielectric layer 126a followed by a metal filling process. The lower metal layer 124 may be one of the metal layers of the BEOL interconnect structure.

As shown in cross-sectional views 1800-2300 of FIGS. 18-23, a stack of device layers is formed over the lower metal layer 124 through a series of deposition and patterning processes. The stack of device layers may comprise an OS channel layer 106, a 2D contacting layer 112, and a ferroelectric layer 104. The deposition and patterning processes can be performed in various ways and an example is illustrated below with more details.

Figure 18:
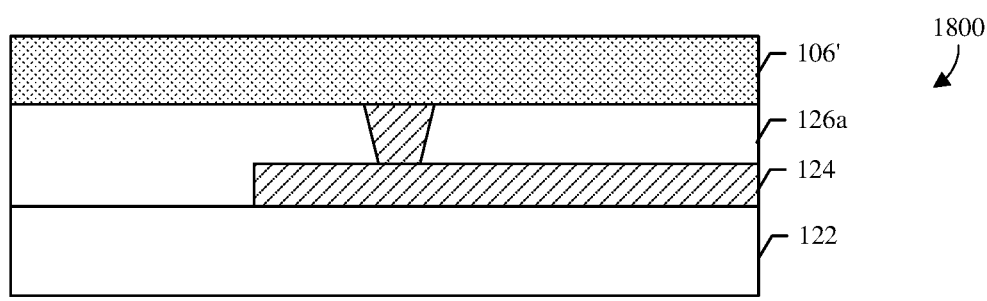

As shown in FIG. 18, in some embodiments, an OS channel precursor layer 106' is formed over the lower metal layer 124. The OS channel precursor layer 106' may be formed by way of one or more deposition processes (e.g., ALD processes, CVD processes, PE-CVD processes, PVD processes, or the like) with one or more oxide semiconductor materials having a first type of semiconductor (e.g., an n-type semiconductor having electrons as a majority carrier) such as indium gallium zinc oxide (IGZO), indium gallium zinc tin oxide (IGZTO), indium tungsten oxide (IWO), indium tungsten zinc oxide (IWZO), indium zinc oxide (IZO), zinc oxide (ZnO), or the like.

Figure 19:
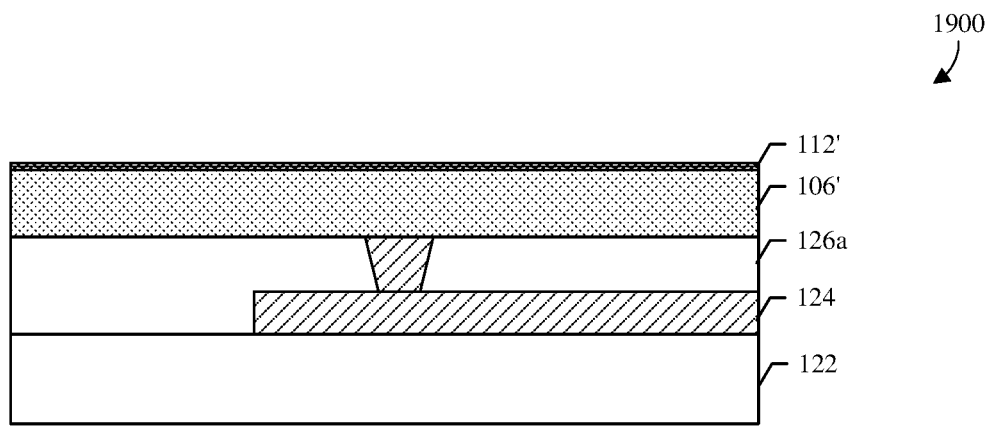

As shown in FIG. 19, in some embodiments, a 2D material contacting precursor layer 112' is formed over or directly on the OS channel precursor layer 106'. In some embodiments, the 2D material contacting precursor layer 112' is formed conformally on the entire top surface of the OS channel precursor layer 106' with a monolayer or multilayer two-dimensional material that is crystalline solids consisting of a single layer of atoms. In some embodiments, the 2D material contacting precursor layer 112' is formed using deposition technique (e.g., ALD processes, CVD processes, PE-CVD processes, MBE processes, or the like.) The 2D material contacting precursor layer 112' may alternatively be formed on a sacrificial substrate and then transferred to the OS channel precursor layer 106'. In some embodiments, the 2D material contacting precursor layer 112' is inherently doped, while in other embodiments the 2D material contacting precursor layer 112' is doped by way of an implantation. The two-dimensional material is derived from single element or compounds of two or more elements. The 2D material contacting precursor layer 112' has a second doping type that is different than the first doping type of the OS channel precursor layer 106'. For example, the 2D contacting layer 112 may comprise a p-type single element two-dimensional material such as graphene, borophene or compound two-dimensional material such as $MoS_2$, $MoSe_2$, $MoTe_2$, or other transition metal dichalcogenides (TMDs) having holes outnumbering free electrons. In other embodiments, the OS channel precursor layer 106' is formed with a p-type doped semiconductor or oxide semiconductor while the 2D material contacting precursor layer 112' is formed with an n-type doped material process.

Figure 20:
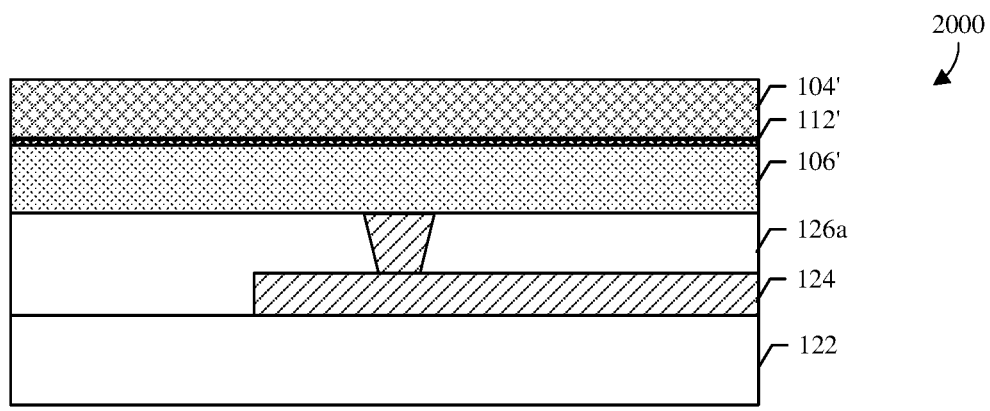

As shown in FIG. 20, in some embodiments, a ferroelectric precursor layer 104' is formed over or directly on the 2D material contacting precursor layer 112'. The ferroelectric precursor layer 104' may be formed by way of one or more deposition processes (e.g., ALD processes, CVD processes, PE-CVD processes, PVD processes, or the like) with one or more ferroelectric materials such as hafnium oxide, hafnium zinc oxide, or the like.

Figure 21:
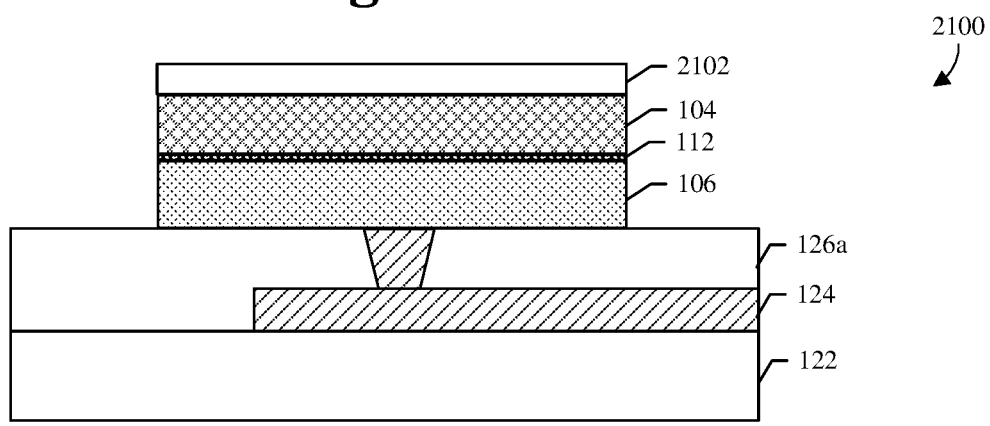

As shown in FIG. 21, in some embodiments, the ferroelectric precursor layer 104', the 2D material contacting precursor layer 112', and the OS channel precursor layer 106' are patterned by a first patterning process according to a masking layer 2102 to form the ferroelectric layer 104, the 2D contacting layer 112, and the OS channel layer 106 having sidewalls aligned with one another. The first patterning process may comprise a series dry and/or wet etching process that remove excessive portions of the ferroelectric precursor layer 104', the 2D material contacting precursor layer 112', and the OS channel precursor layer 106' (see FIG. 20) not covered by the masking layer 2102.

Figure 22:
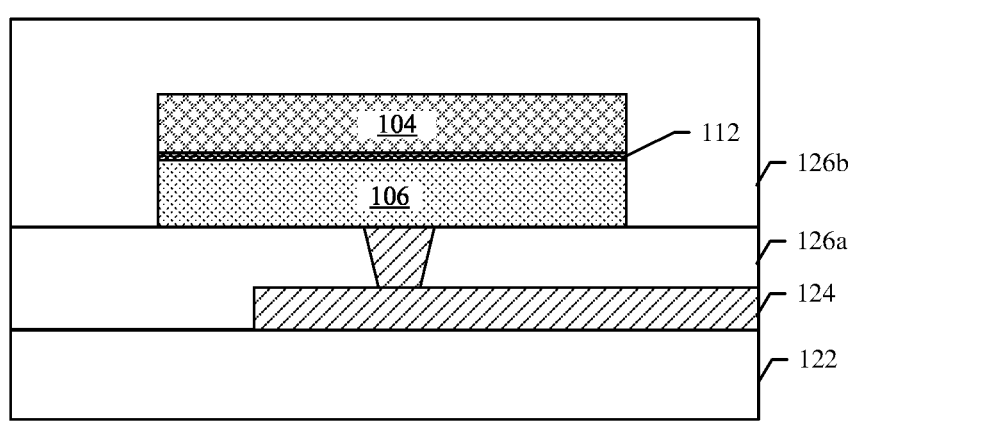

As shown in FIG. 22, in some embodiments, a second dielectric layer 126b is formed over the first dielectric layer 126a and surrounding and over the ferroelectric layer 104, the 2D contacting layer 112, and the OS channel layer 106. In various embodiments, the second dielectric layer 126b may be formed by way of one or more deposition processes (e.g., ALD processes, CVD processes, PE-CVD processes, PVD processes, or the like) followed by a planarization process. Additional isolation processes may be performed prior to forming the second dielectric layer 126b surrounding and over the ferroelectric layer 104, the 2D contacting layer 112, and the OS channel layer 106.

Figure 23:
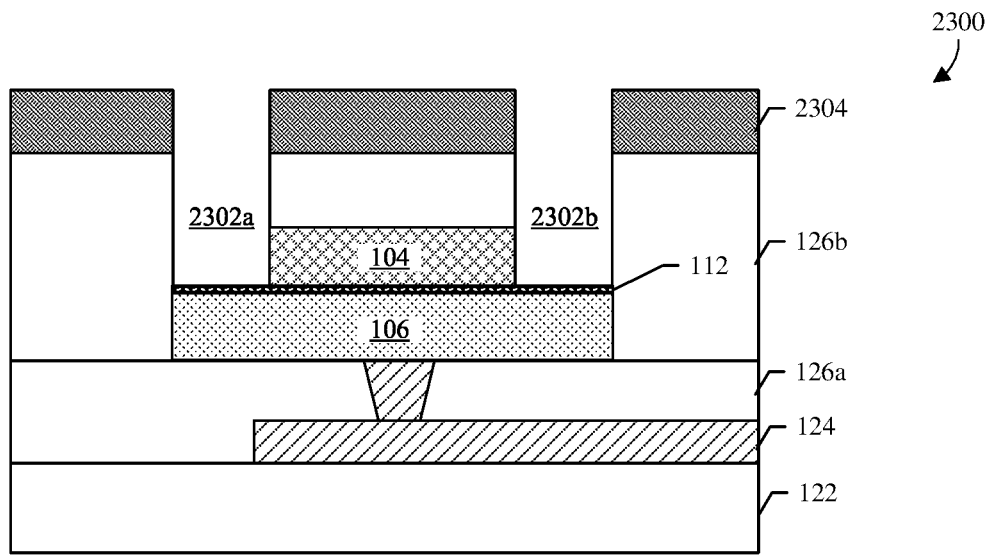

As shown in FIG. 23, in some embodiments, source/drain contact holes 2302a, 2302b are formed through the second dielectric layer 126b. In some embodiments, the source/drain contact holes 2302a, 2302b are further extended through the ferroelectric layer 104 and exposed to opposite sidewalls of the ferroelectric layer 104. The source/drain contact holes 2302a, 2302b may be formed by a patterning process performed to pattern the second dielectric layer 126b and the ferroelectric layer 104 according to a masking layer 2304 by dry and/or wet etching processes. The source/drain contact holes 2302a, 2302b may reach on the 2D contacting layer 112. In some embodiments, a doping process and/or an annealing process is performed to the exposed portion of the 2D contacting layer 112 in the source/drain contact holes 2302a, 2302b to increase doping concentration of the 2D contacting layer 112 locally, such that the 2D contacting layer 112 in the source/drain contact holes 2302a, 2302b is more heavily doped to lower source/drain contact resistance than the middle region below the ferroelectric layer 104. For example, a nitrogen annealing process may be performed to the 2D contacting layer 112 in the source/drain contact holes 2302a, 2302b.

Figure 24:
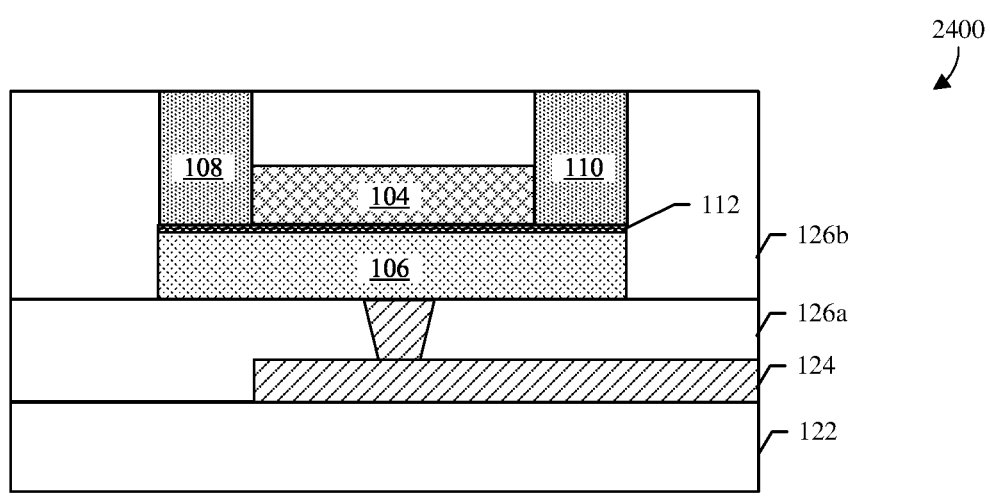

As shown in cross-sectional view 2400 of FIG. 24, a conductive material is formed within the source/drain contact holes 2302a, 2302b (see FIG. 23). In some embodiments, the conductive material may comprise a metal, such as copper, tungsten, cobalt, or the like. In some embodiments the conductive material may be deposited by one or more of a deposition process and a plating process. In some embodiments, a deposition process may be used to form a seed layer of a conductive material followed by a plating process to fill in the source/drain contact holes 2302a, 2302b. In some embodiments, after formation of the conductive material, a planarization process may be performed to remove excess of the conductive material from over the second dielectric layer 126b and to define source/drain regions 108, 110.

Figure 25:
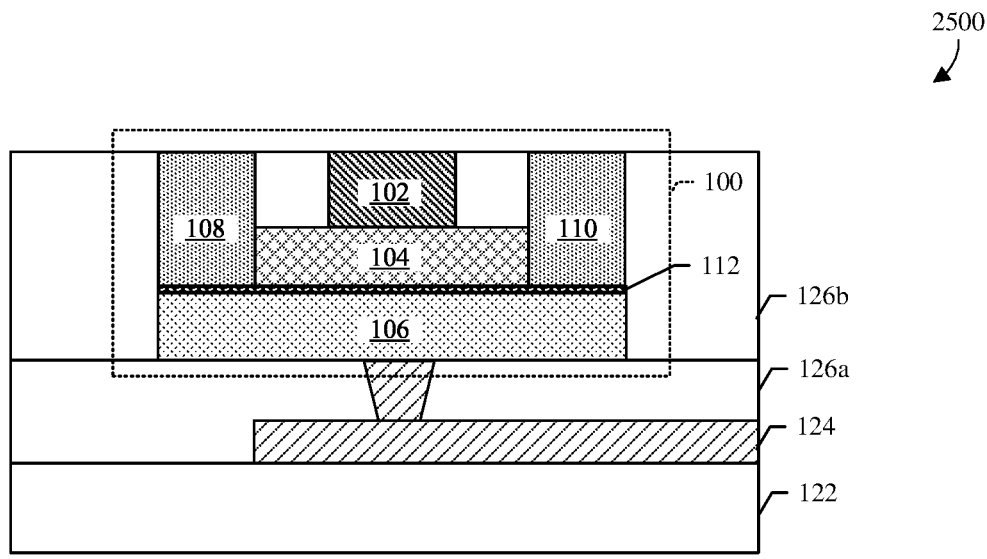

As shown in cross-sectional view 2500 of FIG. 25, a gate electrode 102 is formed in the second dielectric layer 126b reaching on an upper surface of the ferroelectric layer 104. The gate electrode 102 may be formed by a patterning process to define a gate contact hole in the second dielectric layer 126b followed by a filling process of a conductive material. The conductive material may comprise a metal, such as copper, tungsten, cobalt, or the like. In some embodiments the conductive material may be deposited by one or more of a deposition process and a plating process. In some embodiments, a deposition process may be used to form a seed layer of a conductive material followed by a plating process. In some embodiments, after formation of the conductive material, a planarization process may be performed to remove excess of the conductive material from over the second dielectric layer 126b.

In some alternative embodiments (not shown), the source/drain regions 108, 110 and the gate electrode 102 may be formed using one filling process following the concurrent patterning of source/drain contact holes and the gate contact hole.

Figure 26:
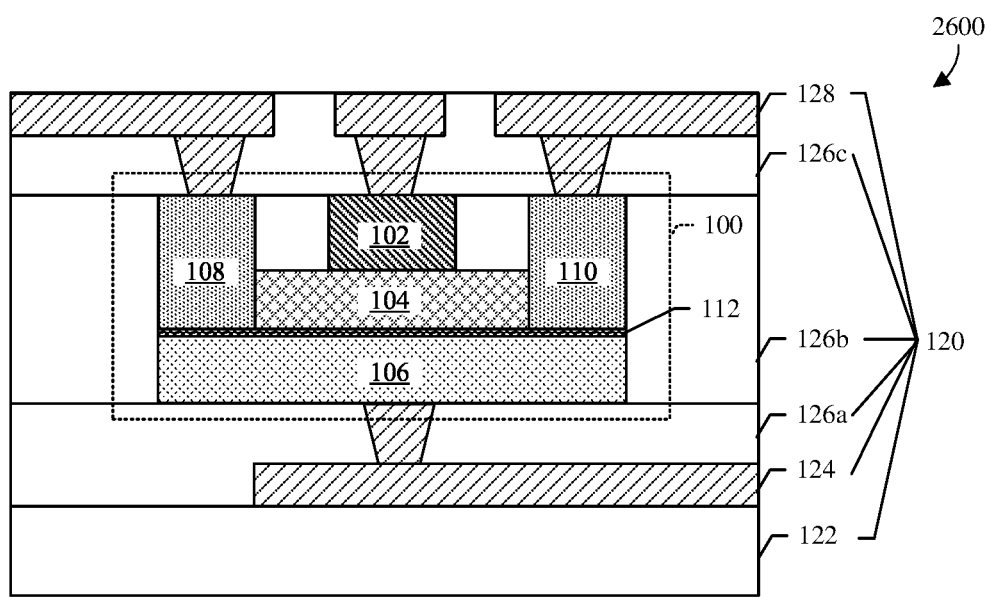

As shown in cross-sectional view 2600 of FIG. 26, a third dielectric layer 126c and an upper metal layer 128 is formed over the stack of device layers. The metal layers 124, 128 and the dielectric layers 126a, 126b, 126c are collectively formed as an interconnect structure 120. The dielectric layers 126a, 126b, 126c may be respectively formed with one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like. Though not shown in the figures, the dielectric layers 126a, 126b, 126c may be separated by one or more etch stop layers. The one or more etch stop layers may be formed with a carbide (e.g., silicon carbide, silicon oxycarbide, or the like), a nitride (e.g., silicon nitride, silicon oxynitride, or the like), or the like. The dielectric layers 126a, 126b, 126c are shown as examples and can be formed as fewer or more layers of dielectric. In some embodiments, the upper metal layer 128 is formed to have metal lines or metal vias directly contact or electrically coupled to the source/drain regions 108, 110 and the gate electrode 102 through conductive contacts and/or additional metal layers. In some embodiments, the upper metal layer 128 may be formed by way of a damascene process (e.g., a single damascene process or a dual damascene process).

Figure 27:
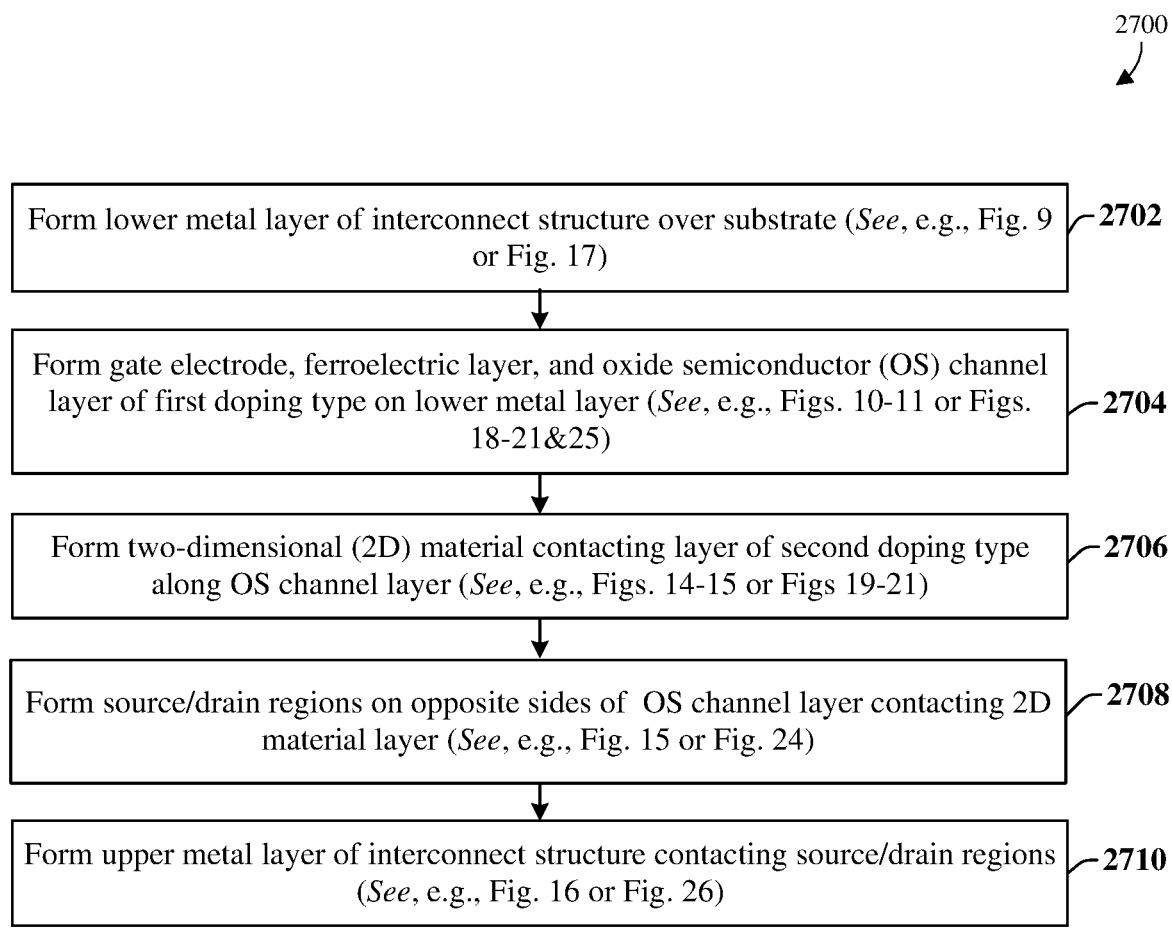
FIG. 27 illustrates a flow diagram of some embodiments of a method of forming an integrated chip comprising a FeFET device having a 2D contacting layer disposed along an OS channel layer.

FIG. 27 illustrates a flow diagram of some embodiments of a method 2700 of forming an integrated chip comprising a FeFET device having a 2D contacting layer disposed along an OS channel layer.

While the disclosed method 2700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2702, a lower metal layer of an interconnect structure is formed over a substrate. FIG. 9 or FIG. 17 illustrates a cross-sectional view 900 or 1700 of some embodiments corresponding to act 2702.

At act 2704, a stack of device layers is formed including a gate electrode, a ferroelectric layer, and an OS channel layer formed on the lower metal layer. The stack of device layers may be formed by a series of deposition and patterning processes. The OS channel layer is of first doping type (e.g., an n-type, which has electrons as a majority carrier). In some embodiments, the gate electrode is formed between the ferroelectric layer and the lower metal layer to form a back-gate FeFET device. In some alternative embodiments, the OS channel layer is formed closer to the lower metal layer, and the ferroelectric layer and the gate electrode are then formed above the OS channel layer to formed a front-gate FeFET device. FIGS. 10-11 illustrate cross-sectional views 1000-1100 of some embodiments corresponding to act 2704. FIGS. 18-21 and 25 illustrate cross-sectional views 1800-2100 and 2500 of some alternative embodiments corresponding to act 2704.

At act 2706, a 2D contacting layer is formed along the OS channel layer. The 2D contacting layer is of second doping type (e.g., a p-type, which has holes as a majority carrier) that is different than the first doping type. The 2D contacting layer may be deposited or transferred from a sacrificial substrate. The 2D contacting layer may be formed on the OS channel layer. In some embodiments, the 2D contacting layer is formed contacting a portion of an upper surface of the OS channel layer and conformally along and cover bottom and sidewall surfaces of source/drain contact holes. In some alternative embodiments, the 2D contacting layer is formed covering the entire top surface of the OS channel layer. In some embodiments, a doping process and/or an annealing process is performed to ending portions of the 2D contacting layer to increase doping concentration of the 2D contacting layer locally, such that the ending portions of the 2D contacting layer are more heavily doped than a middle region. Thus, source/drain contact resistance can be lowered while the OS channel layer is not shorted. FIGS. 14-15 illustrate cross-sectional views 1400-1500 of some embodiments corresponding to act 2706. FIGS. 19-21 illustrate cross-sectional views 1900-2100 of some alternative embodiments corresponding to act 2706.

At act 2708, source/drain regions are formed on opposite sides of the OS channel layer contacting the 2D contacting layer. The source/drain regions may be formed by etching source/drain contact holes within an interlayer dielectric followed by filling a conductive material within the source/drain contact holes. FIG. 15 or FIG. 24 illustrates a cross-sectional view 1500 or 2400 of some embodiments corresponding to act 2708.

At act 2710, one or more additional metal layers of the interconnect structure are formed over the stack of device layers. The one or more additional metal layers may be formed with metal lines or vias directly contacting or electrically coupled through additional conductive contacts to the source/drain regions and/or the gate electrode. FIG. 16 or FIG. 26 illustrates a cross-sectional view 1600 or 2600 of some embodiments corresponding to act 2708.

Accordingly, in some embodiments, the present disclosure relates to an integrated chip comprising a FeFET device having a 2D contacting layer disposed along an oxide semiconductor layer configured to act as a channel (OS channel layer). The 2D contacting layer has a second doping type (e.g., p-type or n-type) different than a first doping type (e.g., n-type or p-type) of the OS channel layer. In some embodiments, the 2D contacting layer is disposed between and contacting source/drain regions of the FeFET device and the OS channel layer, and thus not only provides supplemental carrier chargers to reinforce data programing of the FeFET device, but also acts reduces contact resistance between the source/drain regions and the OS channel layer.

In some embodiments, the present disclosure relates to a FeFET device. The FeFET device includes a ferroelectric layer having a first side and a second side opposite to the first side and a gate electrode disposed along the first side of the ferroelectric layer. The FeFET device further includes an OS channel layer disposed along the second side of the ferroelectric layer opposite to the first side and a pair of source/drain regions disposed on opposite sides of the OS channel layer. The FeFET device further includes a 2D contacting layer disposed along the OS channel layer. The OS channel layer has a first doping type, and the 2D contacting layer has a second doping type different than the first doping type.

In other embodiments, the present disclosure relates to an integrated chip. The integrated chip includes an interconnect structure disposed over a substrate. The interconnect structure includes a lower metal layer and an upper metal layer stacked over the lower metal layer. A FeFET device is inserted between the lower metal layer and the upper metal layer. The FeFET device includes a gate electrode disposed over the lower metal layer, a ferroelectric layer disposed over the gate electrode, and an oxide semiconductor (OS) channel layer disposed over the ferroelectric layer. The FeFET device further includes a pair of source/drain regions disposed on opposite sides of the OS channel layer and a 2D contacting layer disposed along the OS channel layer. The OS channel layer has a first doping type, and the 2D contacting layer has a second doping type different than the first doping type.

In other embodiments, the present disclosure relates to a method of forming a FeFET device. The method includes forming a lower metal layer of an interconnect structure over a substrate and forming a stack of a gate electrode, a ferroelectric layer, and an oxide semiconductor (OS) channel layer one stacked over another over the lower metal layer. The method further includes forming a 2D contacting layer along the OS channel layer. The OS channel layer has a first doping type, and the 2D contacting layer has a second doping type different than the first doping type. The method further includes forming a pair of source/drain regions at opposite sides of the OS channel layer and forming an upper metal layer of the interconnect structure having metal vias contacting the pair of source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric field-effect transistor (FeFET) device, comprising:
    a ferroelectric layer having a first side and a second side opposite to the first side;
    a gate electrode disposed along the first side of the ferroelectric layer;
    an oxide semiconductor (OS) channel layer disposed along the second side of the ferroelectric layer opposite to the first side, the OS channel layer having a first doping type;
    a two-dimensional (2D) contacting layer disposed along the OS channel layer, the 2D contacting layer having a second doping type different than the first doping type; and
    a pair of source/drain regions having a bottom surface contacting an upper surface of the 2D contacting layer opposite to the OS channel,
    wherein the 2D contacting layer comprises ending portions underlying the pair of source/drain regions and a middle portion disposed therebetween, the middle portion having a first doping concentration smaller than a second doping concentration throughout the ending portions.

2. The FeFET device of claim 1, wherein the 2D contacting layer comprises graphene.

3. The FeFET device of claim 1, wherein the 2D contacting layer is disposed between and contacting the pair of source/drain regions and the OS channel layer.

4. The FeFET device of claim 1, wherein the 2D contacting layer covers bottom surfaces of the pair of source/drain regions.

5. The FeFET device of claim 1, wherein the 2D contacting layer covers a top surface of the OS channel layer.

6. The FeFET device of claim 5, wherein the ending portions of the 2D contacting layer are configured to lower a contact resistance between the pair of source/drain regions and the OS channel layer.

7. The FeFET device of claim 1, wherein the 2D contacting layer is disposed directly on a top surface of the OS channel layer.

8. The FeFET device of claim 1, wherein the ending portions of the 2D contacting layer connect and directly contact the pair of source/drain regions and the OS channel layer.

9. The FeFET device of claim 1, wherein the first doping type is n-type and the second doping type is p-type.

10. The FeFET device of claim 1, wherein the OS channel layer comprises one or more of indium gallium zinc oxide, indium gallium zinc tin oxide, indium tungsten oxide, indium tungsten zinc oxide, indium zinc oxide, and zinc oxide.

11. An integrated chip, comprising:
    an interconnect structure disposed over a substrate comprising a lower metal layer and an upper metal layer stacked over the lower metal layer; and
    a ferroelectric field-effect transistor (FeFET) device inserted between the lower metal layer and the upper metal layer, comprising:
        a gate electrode disposed on the lower metal layer;
        a ferroelectric layer disposed on the gate electrode;
        an oxide semiconductor (OS) channel layer disposed over the ferroelectric layer, the OS channel layer having a first doping type;
        a pair of source/drain regions disposed on opposite sides of the OS channel layer; and
        a two-dimensional (2D) contacting layer separating the pair of source/drain regions and the OS channel layer, the 2D contacting layer having a second doping type different than the first doping type;
        wherein the 2D contacting layer is a monolayer or multilayer two-dimensional material consisting of a single layer of atoms that contacts the pair of source/drain regions and the OS channel layer.

12. The integrated chip of claim 11, wherein the 2D contacting layer is disposed on an upper surface of the OS channel layer.

13. The integrated chip of claim 11, wherein the 2D contacting layer comprising ending portions that respectively covers bottom surfaces of the pair of source/drain regions.

14. The integrated chip of claim 11, wherein the pair of source/drain regions is respectively coupled to a source-line and a bit-line, and the gate electrode is coupled to a word-line.

15. The integrated chip of claim 11, wherein the 2D contacting layer comprises one or more of graphene or molybdenum disulfide ($MoS_2$), molybdenum diselenide ($MoSe_2$), or molybdenum ditelluride ($MoTe_2$).

16. The integrated chip of claim 11, wherein the 2D contacting layer is disposed directly on a top surface of the OS channel layer.

17. The integrated chip of claim 11, wherein the 2D contacting layer has ending portions underlying the source/drain regions more heavily doped than a middle portion between the source/drain regions, the ending portions having a doping concentrations in a range of between approximately $1 \times 10^{18}$ at/$cm^3$ and approximately $1 \times 10^{21}$ at/$cm^3$, while the middle portion having a doping concentration in a range of between approximately $1 \times 10^{16}$ at/$cm^3$ and approximately $1 \times 10^{18}$ at/$cm^3$.

18. The integrated chip of claim 11, wherein the OS channel layer comprises one or more of indium gallium zinc oxide, indium gallium zinc tin oxide, indium tungsten oxide, indium tungsten zinc oxide, indium zinc oxide, and zinc oxide.

19. A method of forming a FeFET device, comprising:
    forming a lower metal layer of an interconnect structure over a substrate;
    forming a stack of a gate electrode, a ferroelectric layer, and an oxide semiconductor (OS) channel layer one stacked over another over the lower metal layer, the OS channel layer having a first doping type;

forming a two-dimensional (2D) contacting layer along the OS channel layer, the 2D contacting layer having a second doping type different than the first doping type;

forming a pair of source/drain regions at one side of the 2D contacting layer opposite to the OS channel layer; and forming an upper metal layer of the interconnect structure having metal vias contacting the pair of source/drain regions;

wherein the pair of source/drain regions has a bottom surface disposed on the 2D contacting layer.

20. The method of claim 19, wherein the 2D contacting layer is formed with ending portions underlying the source/drain regions doped vertically throughout more heavily than a middle portion between the source/drain regions.

* * * * *